(12) United States Patent
Todorow et al.

(10) Patent No.: US 10,290,469 B2
(45) Date of Patent: May 14, 2019

(54) ENHANCED PLASMA SOURCE FOR A PLASMA REACTOR

(71) Applicant: Applied Materials, Inc., Santa Clara, CA (US)

(72) Inventors: Valentin N. Todorow, Palo Alto, CA (US); Gary Leray, Mountain View, CA (US); Michael D. Willwerth, Campbell, CA (US); Li-Sheng Chiang, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 834 days.

(21) Appl. No.: 14/293,516

(22) Filed: Jun. 2, 2014

(65) Prior Publication Data

US 2014/0367046 A1    Dec. 18, 2014

Related U.S. Application Data

(60) Provisional application No. 61/835,966, filed on Jun. 17, 2013.

(51) Int. Cl.
*H05H 1/46*    (2006.01)
*H01J 37/32*   (2006.01)

(52) U.S. Cl.
CPC ...... *H01J 37/32082* (2013.01); *H01J 37/321* (2013.01); *H01J 37/32532* (2013.01);
(Continued)

(58) Field of Classification Search
CPC ............. H05H 2001/4667; H05H 1/46; H05H 2001/4645; H01J 37/321; H01J 37/32082;
(Continued)

(56) References Cited

U.S. PATENT DOCUMENTS 4,849,675 A * 7/1989 Muller .............. H01J 27/16
                                                  313/230
5,266,364 A   11/1993 Tamura et al.
(Continued)

FOREIGN PATENT DOCUMENTS

CN    1555568 A    12/2004
CN  102054648 A     5/2011
(Continued)

OTHER PUBLICATIONS

PCT international search report and written opinion of PCT/US2014/038233 dated Oct. 10, 2014. PCT search report is being used as the English translation for foreign reference: KR-10-2011-0065275-A.
(Continued)

*Primary Examiner* — Rakesh K Dhingra
*Assistant Examiner* — Laureen Chan
(74) *Attorney, Agent, or Firm* — Patterson + Sheridan, LLP

(57) ABSTRACT

Embodiments of an apparatus having an improved coil antenna assembly that can provide enhanced plasma in a processing chamber is provided. The improved coil antenna assembly enhances positional control of plasma location within a plasma processing chamber, and may be utilized in etch, deposition, implant, and thermal processing systems, among other applications where the control of plasma location is desirable. In one embodiment, an electrode assembly configured to use in a semiconductor processing apparatus includes a RF conductive connector, and a conductive member having a first end electrically connected to the RF conductive connector, wherein the conductive member extends outward and vertically from the RF conductive connector.

17 Claims, 3 Drawing Sheets

(52) U.S. Cl.
CPC ....... *H05H 1/46* (2013.01); *H05H 2001/4645* (2013.01); *H05H 2001/4667* (2013.01)

(58) Field of Classification Search
CPC ................ H01J 37/32532; H01J 37/32; H01J 37/32577; H01J 37/3211
See application file for complete search history.

(56) References Cited

U.S. PATENT DOCUMENTS

| | | | |
|---|---|---|---|
| 5,685,941 A * | 11/1997 | Forster .............. | H01J 37/32091 118/723 E |
| 6,685,798 B1 * | 2/2004 | Holland ................ | H01J 37/321 118/723 AN |
| 6,983,892 B2 | 1/2006 | Noorbakhsh et al. | |
| 2002/0005392 A1 | 1/2002 | Luo et al. | |
| 2003/0014595 A1 | 1/2003 | Doteguchi et al. | |
| 2003/0145952 A1 * | 8/2003 | Wilcoxson ........ | H01J 37/32467 156/345.48 |
| 2004/0191545 A1 | 9/2004 | Han et al. | |
| 2005/0020070 A1 | 1/2005 | Ichiki et al. | |
| 2005/0239291 A1 | 10/2005 | Alba et al. | |
| 2007/0068624 A1 | 3/2007 | Jeon et al. | |
| 2008/0078506 A1 * | 4/2008 | Verbeck .............. | H01J 37/28 156/345.48 |
| 2009/0236315 A1 | 9/2009 | Willwerth et al. | |
| 2010/0025384 A1 * | 2/2010 | Todorow ........... | H01J 37/32091 219/121.54 |
| 2011/0048644 A1 | 3/2011 | Collins et al. | |
| 2011/0097901 A1 * | 4/2011 | Banna .................. | H01J 37/321 438/710 |
| 2011/0201134 A1 | 8/2011 | Hoffman et al. | |
| 2012/0043023 A1 | 2/2012 | Ramaswamy et al. | |
| 2012/0073757 A1 * | 3/2012 | Yamazawa .......... | H01J 37/3211 156/345.48 |
| 2012/0097870 A1 | 4/2012 | Leray et al. | |
| 2012/0103524 A1 | 5/2012 | Chebi et al. | |
| 2012/0104950 A1 | 5/2012 | Banna et al. | |
| 2012/0211358 A1 | 8/2012 | Miller et al. | |

FOREIGN PATENT DOCUMENTS

| | | |
|---|---|---|
| CN | 102421239 A | 4/2012 |
| JP | 2011530143 A | 12/2011 |
| KR | 10-2011-0065275 A | 6/2011 |

OTHER PUBLICATIONS

Office Action from Japanese Patent Application No. 2016-521411 dated Nov. 21, 2017.
Office Action for Chinese Patent Application No. 201480034383.2 dated Nov. 16, 2017.
Taiwan Office Action dated Oct. 6, 2017 for Application No. 103118105.

* cited by examiner

ENHANCED PLASMA SOURCE FOR A PLASMA REACTOR

CROSS-REFERENCE TO RELATED APPLICATION

This application claims benefit of U.S. Provisional Application Ser. No. 61/835,966 filed Jun. 17, 2013, which is incorporated by reference in its entirety.

BACKGROUND

Field

Embodiments generally relate to an apparatus of semiconductor substrate processing systems. More specifically, embodiments relates to an enhanced plasma generation assembly for a plasma processing system.

Background

In manufacture of integrated circuits, precise control of various process parameters is required for achieving consistent results within a substrate, as well as the results that are reproducible from substrate to substrate. As the geometry limits of the structures for forming semiconductor devices are pushed against technology limits, tighter tolerances and precise process control are critical to fabrication success. However, with shrinking geometries, precise critical dimension and etch process control has become increasingly difficult.

Many semiconductor devices are processed in the presence of a plasma. The plasma may be easily ignited in processing chambers that utilized capacitively coupled power to energize the gases forming the plasma. However, plasma ignition in other types of processing chambers may not be as easily initiated, often requiring a spike of power to ignite the gases within the chamber. Unfortunately, such power spikes often results is arcing and sputtering of chamber components, which diminish the service life of the chamber components and undesirably generate particles within the processing chamber which undesirably contributes to defect rates.

Therefore, there is a need for an apparatus and methods for improving plasma ignition within a processing chamber.

SUMMARY

Embodiments generally provide an improved coil antenna assembly that can provide enhanced plasma ignition in a processing chamber. The improved coil antenna assembly enhances plasma ignition substantially without power increase or sputtering of chamber components, and may be utilized in etch, deposition, implant, and thermal processing systems, among other applications where plasma generation with reduced sputtering of chamber components is desirable.

In one embodiment, a coil antenna assembly is provided that enhances plasma ignition within a processing chamber having a lid on which the coil antenna assembly is disposed. The coil antenna assembly includes a coil having an electrode assembly electrically connected to proximate a first end of the coil. The electrode assembly extends from the first end of the coil towards the second end of the coil. In operation, the electrode assembly takes the voltage of the first end of the coil and provides a higher voltage proximate the lid of the processing chamber.

In one embodiment, an electrode assembly configured to use in a semiconductor processing apparatus includes a RF conductive connector, and a conductive member having a first end electrically connected to the RF conductive connector, wherein the conductive member extends outward and vertically from the RF conductive connector.

In another embodiment, a plasma processing chamber includes a chamber body, a lid enclosing an interior volume of the chamber body, a substrate support disposed in the interior volume, a coil antenna assembly positioned adjacent the lid for coupling RF power to the chamber body, and an electrode assembly electrically connected to the coil antenna assembly.

In yet another embodiment, a plasma processing chamber includes a chamber body, a lid enclosing an interior volume of the chamber body, a substrate support disposed in the interior volume, a coil antenna assembly having a plurality of windings positioned adjacent the lid for coupling RF power to the chamber body, and an electrode assembly electrically connected to each windings disposed in the coil antenna assembly.

BRIEF DESCRIPTION OF THE DRAWINGS

So that the manner in which the above recited features of the embodiments as provided can be understood in detail, a more particular description of the embodiments, briefly summarized above, may be had by reference to embodiments, some of which are illustrated in the appended drawings. It is to be noted, however, that the appended drawings illustrate only typical embodiments as described herein and are therefore not to be considered limiting of its scope, may admit to other equally effective embodiments.

Figure 1:
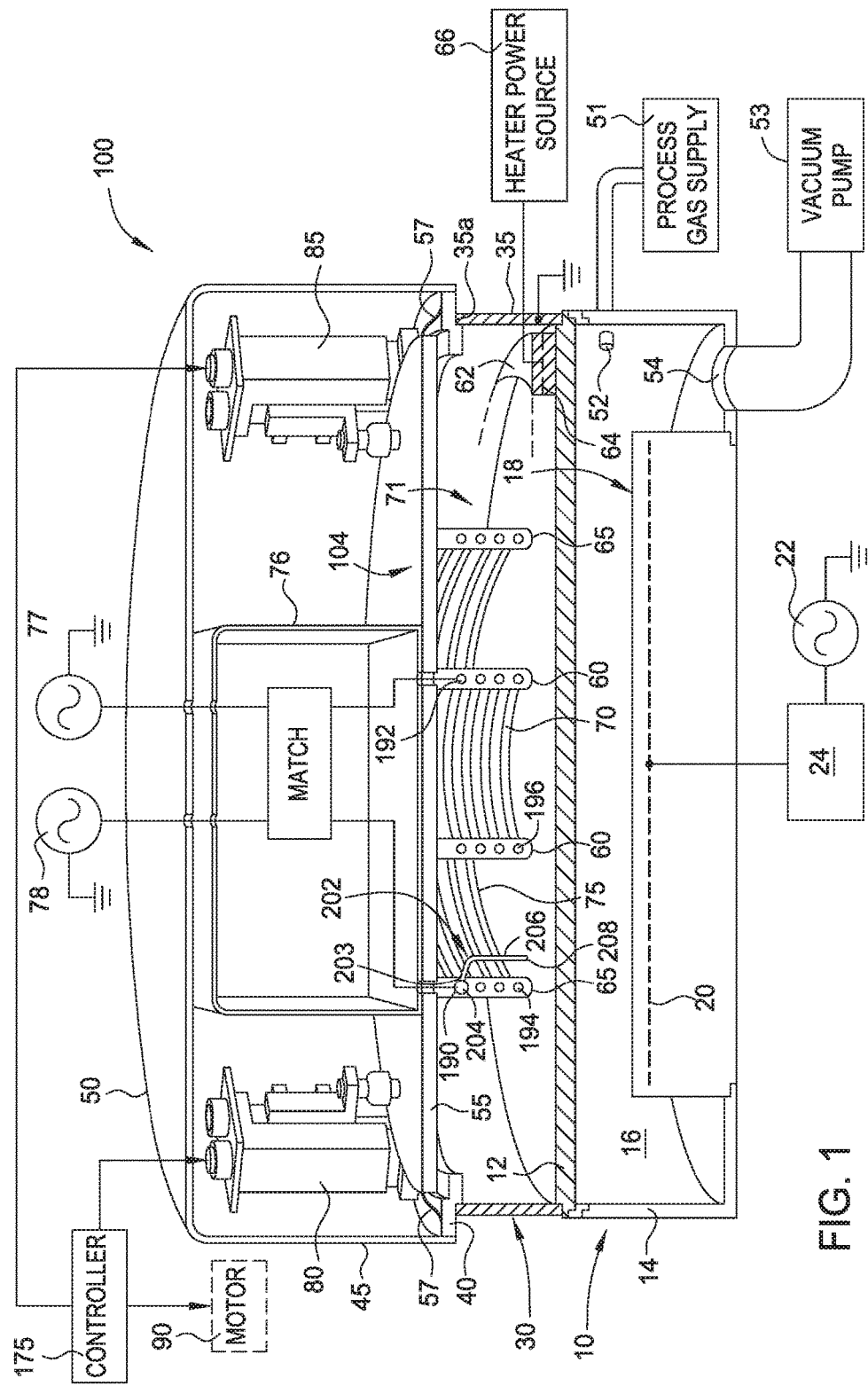
FIG. 1 is a schematic diagram of an exemplary semiconductor substrate processing apparatus comprising an improved coil antenna assembly in accordance with one embodiment.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

Embodiments generally provide an improved coil antenna assembly that can provide enhanced plasma distribution in a processing chamber. The improved coil antenna assembly enhances positional control of plasma location within a plasma processing chamber, and may be utilized in etch, deposition, implant, and thermal processing systems, among other applications where the control of plasma location is desirable.

FIG. 1 is a schematic diagram of an exemplary semiconductor substrate processing apparatus 100 comprising an improved coil antenna assembly 104. In one embodiment, the semiconductor substrate processing apparatus 100 of FIG. 1 may be configured to perform a reactive ion etch process using an RF inductively coupled plasma generated by the coil antenna assembly 104 disposed in the semiconductor substrate processing apparatus 100. It is also contemplated that the improved coil antenna assembly 104 may beneficially be utilized in other types of plasma processing chambers, including chemical vapor deposition chambers, physical vapor deposition chambers, implantation chambers, nitriding chambers, plasma annealing chambers, plasma treatment chambers, and ashing chambers, among others. Thus, the embodiment of exemplary semiconductor substrate processing apparatus 100 of FIG. 1 is provided for illustrative purposes and should not be used to limit the scope of the embodiments.

The semiconductor substrate processing apparatus 100 includes a chamber body 10 including a lid 12 and a cylindrical side wall 14 defining a processing chamber 16. The lid 12 is transmissive to RF power and allows coupling of RF power provided by an inductively coupled plasma source power applicator 71 positioned above the lid 12 to process gases within the processing chamber 16. The lid 12 may be fabricated from any suitable material, and in the embodiment depicted in FIG. 1, the lid 12 is fabricated from a dielectric material, such as quartz.

A lid heater 62 is disposed on the lid 12 outside of the processing chamber 16. Although only a portion of the lid heater 62 is shown in FIG. 1, the lid heater 62 extends substantially across and covers substantially the entire lid 12. The lid heater 62 controls the temperature of the lid 12, so as to control the deposition and adhesion of by-products to the lid 12, which enhances particle control. The lid heater 62 may be a resistive or other type of heater, and in the embodiment depicted in FIG. 1, the lid heater 62 includes a resistive heating element 64 coupled to a heater power source 66.

Inside the processing chamber 16 is a substrate support pedestal 18 including a bias electrode 20. A plasma bias power generator 22 is coupled through an RF bias impedance match 24 to the bias electrode 20. A process gas supply 51 provides process gas into the processing chamber 16 through process gas distribution apparatus 52 which may be provided in the side wall 14 (as shown) or in the lid 12, for example. A vacuum pump 53 evacuates the processing chamber 16 through a pumping port 54.

An coil antenna enclosure 30 formed of metal is provided above the lid 12 and includes a metallic grounded base cylindrical side wall 35 having a top edge 35a supporting a shoulder ring 40, and a conductive top cylindrical side wall 45 extending from the shoulder ring 40 and supporting an overlying conductive cover 50. The conductive cover 50 and the top cylindrical side wall 45 may be integrally formed together and may be coupled to ground. A floating support plate 55 is located on or slightly above the shoulder ring 40, and is supported in a manner to be described below.

The inductively coupled plasma source power applicator 71 is disposed in the semiconductor substrate processing apparatus 100 configured to generate inductively coupled plasma. The inductively coupled plasma source power applicator 71 includes the improved coil antenna assembly 104. The coil antenna assembly 104 is supported below the support plate 55 by two sets of brackets 60, 65 extending downwardly from the support plate 55. The coil antenna assembly 104 includes at least one coil antenna, and in the embodiment depicted in FIG. 1, the coil antenna assembly 104 includes one or more inner coil antennas 70 and one or more outer coil antennas 75. The outer coil antenna 75 may be concentric with the inner coil antenna 70. The brackets 60 support the inner coil antenna 70 while the brackets 65 support the outer coil antenna 75 above the chamber lid 12. The coil antennas 70, 75 may have a helical configuration. First ends 190, 192 of each coil antennas 75, 70 are coupled through a RF impedance match box 76 to one or more RF power generators 77, 78 while second ends 194, 196 of each coil antennas 75, 70 are coupled to ground. This creates a voltage drop across the coil antennas 75, 70 such that the first ends 190, 192 have a greater voltage potential relative to the second ends 194, 196 of the coil antennas 75, 70.

The coil antenna assembly 104 further includes an electrode assembly 202 that places the voltage potential applied to high voltage regions (i.e., first end 190 of the outer coil antenna 75 shown in FIG. 1) of the coil antenna assembly 104 (e.g., closer to the support plate 55) extending to the lid 12, which is proximate to the low voltage regions (i.e., second end 194 of the outer coil antenna 75) of the coil antenna assembly 104. By placing the electrode assembly 202 which is at the same voltage potential as the first end 190 of the coil antenna assembly 104 extending proximate to or touching the chamber lid 12, a high voltage (relative to the second end 194 of the coil antenna assembly 104) is positioned closer to the process gases within the internal volume of the chamber body 10, so to allow for more effective plasma ignition at lower coil antenna assembly voltages. The ability to use lower plasma ignition voltages reduces sputtering of chamber components, which in turn contributes to increased device yield.

In one embodiment, the electrode assembly 202 includes a RF conductive connector 204 and an elongated conductive member 206 attached thereto. The conductive member 206 may have a first end 203 electrically connected to the RF conductive connector 204 and a second end 208 extending proximate to, or in contact with, the chamber lid 12. More details regarding the electrode assembly 202 will be discussed below with reference to FIGS. 2-4.

The RF impedance match box 76 rests on the support plate 55. The first RF power generator 77 is coupled to the inner coil antenna 70 through impedance match elements (not shown) in the impedance match box 76. The second RF power generator 78 is coupled to the outer coil antenna 75 through other impedance match elements (not shown) in the impedance match box 76.

During plasma processing, the coil antenna assembly 104 is energized with RF power provided by the power generators 77, 78 to maintain a plasma formed from the process gasses within in the internal volume of the chamber body 10.

A flexible RF gasket 57 provides an RF shield and electrical continuity between the shoulder ring 40 and the floating support plate 55. The RF gasket 57 may be an annular copper mesh, and may be interrupted to accommodate the support servos described below. The support plate 55 is supported by three support servos 80, 85, 90 placed at equal (120 degree) intervals on the shoulder ring 40. The support servos 80, 85, 90 are identical in one embodiment.

A control signal cable 170 furnishes electrical control signals and power from a central controller 175 of the semiconductor substrate processing apparatus 100 of FIG. 1. The central controller 175 controls each of the three support servos 80, 85, 90. Placement of the three support servos 80, 85, 90 at equal intervals around the shoulder ring 40 enables the controller 175 to rotate the floating support plate 55 about any tilt axis oriented along any azimuthal angle 0 relative to an axis of symmetry of the processing chamber 16.

Figure 2:
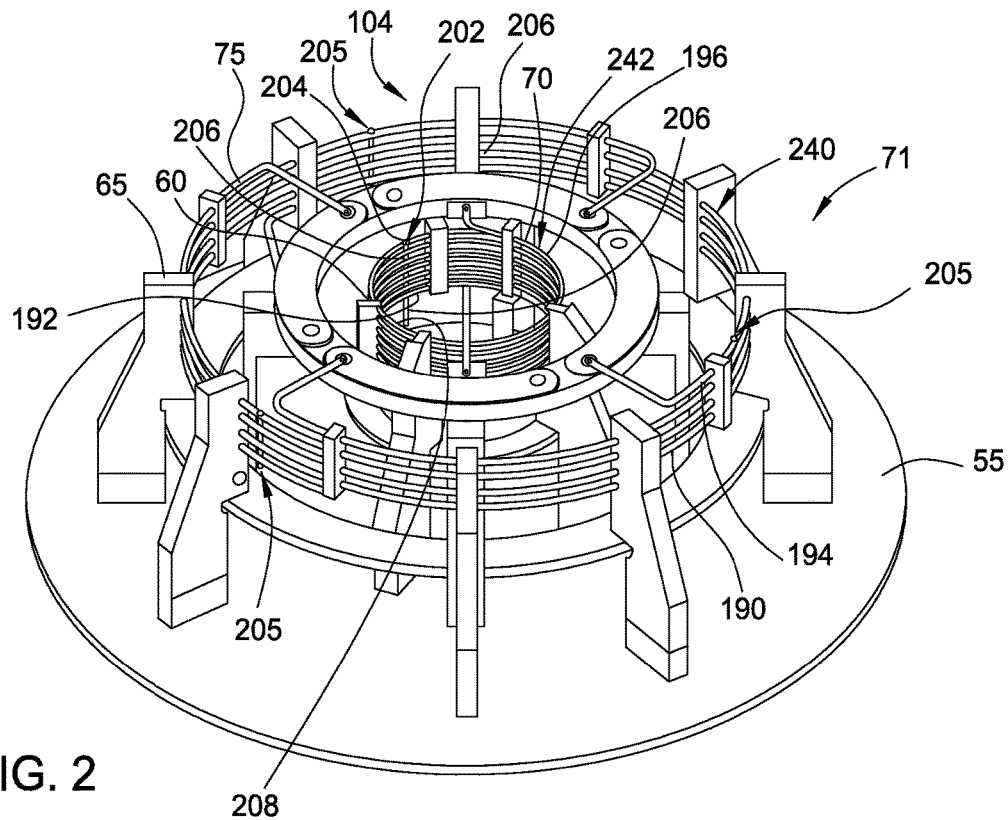
FIG. 2 is a bottom view of one embodiment of the improved coil antenna assembly of FIG. 1.

FIG. 2 is a schematic bottom view of one embodiment of the coil antenna assembly 104 that may be disposed in the semiconductor substrate processing apparatus 100. As discussed above, the coil antenna assembly 104 includes the inner coil antenna 70 and the outer coil antenna 75. Two sets of brackets 60, 65 support the inner coil antenna 70 and the outer coil antenna 75, respectively. The outer coil antenna 75 may include one or more coil windings 240. The inner coil antenna 70 may also include one or more coil windings 242. By way of example in the embodiment depicted in FIG. 2, the outer coil antenna 75 comprises four coil windings 240 while the inner coil antenna 70 comprises four coil windings 242. Each of the windings 240 are coupled in parallel at the first end 190 and second end 194 of the outer coil antenna 75. Likewise, each of the windings 242 are coupled in parallel at the first end 192 and second send 196 of the inner coil antenna 70.

Figure 3:
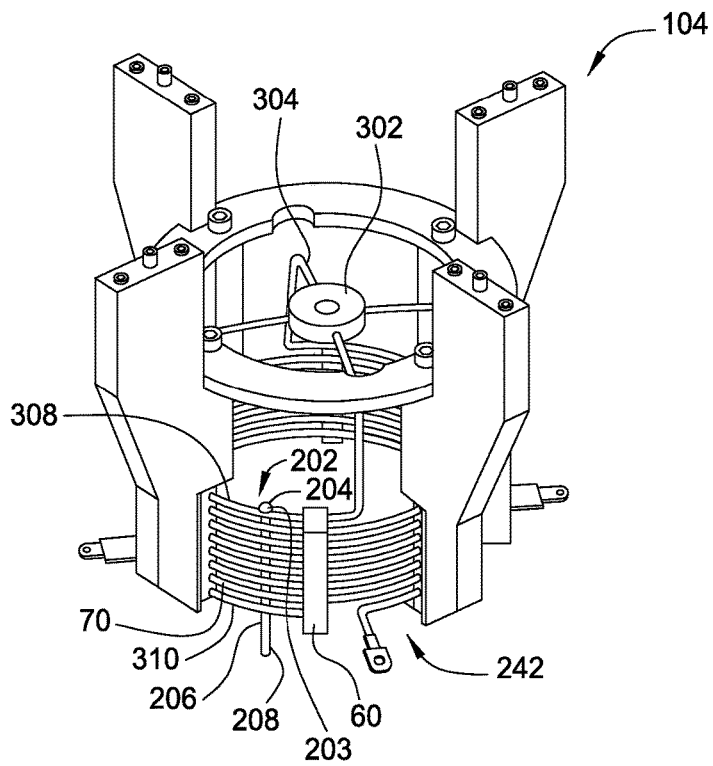
FIG. 3 is top view of an inner coil of the improved coil antenna assembly of FIG. 2.

Referring further to FIG. 3, FIG. 3 depicts a schematic view of the inner coil antenna 70 shown up-side down relative to the configuration depicted the FIG. 2 for ease of explanation. A RF feed receiver 302 is disposed in the inner coil antenna 70 and is adapted to connect to the RF impedance match box 76 (shown in FIG. 1). Four leg coils 304 are connected to the RF feed receiver 302. The leg coils 304 may extend and connect to the multiple windings 242 formed in the inner coil antenna 70. It is noted that the coil windings 242 may be in any numbers as needed for different plasma generation requirements. As discussed above, as an upper most winding 308 (e.g., a first end) of the windings 242 are located closest to the RF feed receiver 302 which is the point where the RF power is supplied to the windings 242. Due to voltage drop cross the windings 242, the uppermost winding 308 of the winding 242 have a higher voltage potential as compared to a lower most winding 310 (e.g., a second end) of the winding 242. Insufficient voltage applied to the lowermost winding 310, which is the one closest to the chamber body 10, may adversely result in insufficient plasma dissociation during an etching process, resulting in etching defects or etching profile deformed. Thus, in order to enhance the uniform distribution of voltage applied to each winding 242 of the inner coil antenna 70, the electrode assembly 202 is utilized to be disposed in the inner coil antenna 70. The electrode assembly 202 includes the RF conductive connector 204 and the conductive member 206 electrically connected to the RF conductive connector 204. In one embodiment, the conductive member 206 may be a rigid or flexible metal structure capable of electrically conducting voltage. In one embodiment, the conductive member 206 may be a metal foil, a metal conductive sheet, a metal plate, a metal rod, or any suitable conductive structure that may extend outward and vertically from the RF conductive connector 204. The conductive member 206 may have the second end 208 extending to close proximately to the lid 12, for example, just above to just below the upper surface of the lid 12. The electrode assembly 202 may assist passing voltage applied to the coil antenna assembly 104 from top (e.g., uppermost winding 308) to down (e.g., lowermost winding 310) of the inner coil antenna 70. In some embodiments, the second end 208 of the conductive member 206 may extend below the lowermost winding 310 of the coil antenna assembly 104.

In one embodiment, the electrode assembly 202 may have the RF conductive connector 204 clipping on the uppermost winding 308 of the inner coil antenna 70. The conductive member 206 coupled to the RF conductive connector 204 may then extend vertically downward to the lowermost winding 310. The conductive member 206 may be in contact with each winding 242 formed in the inner coil antenna 70 to electrically pass down the voltage applied thereon from the uppermost winding 308 to the lowermost winding 310. The conductive member 206 may be electrically connected to or contact with each winding 242 formed in the inner coil antenna 70. Alternatively, the conductive member 206 may be electrically connected to each winding 242 by certain locking mechanism, such as a set screw, wire, metallic insert, spring, retaining ring or other suitable locking mechanism. By such configuration, the conductive member 206 provides a short cut for the voltage supplied thereto to reach down to the lowermost winding 310 at a shorter distance, eliminating long travel among each winding 242 from the uppermost winding 308 to the lowermost winding 310. The electrode assembly 202 provides an alternative (or shorter) path for the voltage to supply from the uppermost winding 308 of the inner coil antenna 70 to reach down to the bottom at a quicker time. Alternatively, the conductive member 206 may be configured to be kept distanced away from each winding 242 in the inner coil antenna 70. By keeping a distance between the winding 242 and the conductive member 206, the voltage supplied to the upper most winding 308 may be directly transmitted from the RF conductive connector 204 to the second end 208 of the conductive member 206, which may be configured to extend into the lid 12 of the processing apparatus 100. In one embodiment, the electrode assembly 202 may be manufactured from a conductive material that is capable of delivering voltage applied to the inner coil antenna 70 from top to bottom. In one embodiment, the RF conductive connector 204 and the conductive member 206 of the electrode assembly 202 are fabricated from a group consisting of stainless steel, copper, aluminum, nickel and alloys thereof.

In some embodiments, the electrode assembly 202 may be coupled to the inner coil antenna 70 at different locations, or also be coupled to the outer coil antenna 75 at different locations. In one example, one electrode assembly 202 may be disposed in the inner coil antenna 70. Furthermore, additional electrode assemblies 205 may be disposed in the outer coil antenna 75, as needed as shown in FIG. 2.

Figure 4:
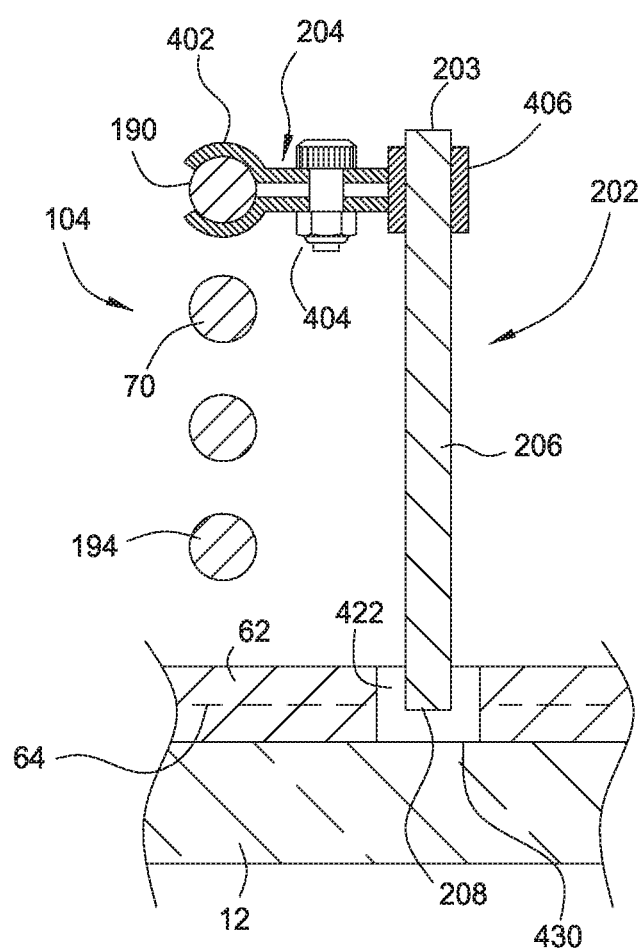
FIG. 4 is a partial sectional of a portion of the coil antenna assembly extending to a lid of the semiconductor substrate processing apparatus of FIG. 1.

FIG. 4 is a partial sectional of a portion of the coil antenna assembly 104 extending to the lid heater 62 and the lid 12 of the semiconductor substrate processing apparatus 100 of FIG. 1. As discussed above, the conductive member 206 of the electrode assembly 202 may have the second end 208 extending to the lid heater 62 disposed in the lid 12 of the semiconductor substrate processing apparatus 100. In some embodiment, the second end 208 of the electrode assembly 202 may further extend down in contact with an upper surface 430 of the lid 12 of the processing chamber as needed. The lid heater 62 generally includes at least one aperture 422 formed therein to receive the second end 208 of the electrode assembly 202. As depicted in the FIG. 4, the RF conductive connector 204 is coupled to the first end 190 of the inner coil antenna 70 through a first clamp 402. A second clamp 406 is utilized to couple the conductive member 206 to the RF conductive connector 204. The first clamp 402 and the second clamp 406 may be jointed and connected by a set screw or nut 404. Although the embodiment shown in FIG. 4 has the conductive member 206 distanced away from the lower windings of the inner coil antenna 70, it is noted that the conductive member 206 may be in contact with each or portion of the windings in the inner coil antenna 70.

Therefore, by utilizing the electrode assembly 202, insufficient plasma power or plasma non-uniformity could be somehow supplemented or corrected, then the remaining non-uniformity, namely the radial non-uniformity, could be eliminated by local control of the RF power levels delivered to different locations of the coil antenna assembly 104. The result would be enhancement of plasma power and etch rate distribution uniformity across the substrate surface.

Thus, an electrode assembly is provided that enhances positioning of the plasma within a processing chamber. As the plasma can be positioned in a more desirable location with sufficient power density, more uniform and predictable processing requests may be realized.

While the foregoing is directed to embodiments as described herein, other and further embodiments may be devised without departing from the basic scope thereof, and the scope thereof is determined by the claims that follow.

What is claimed is:

1. An electrode assembly configured to use in a semiconductor processing apparatus, comprising:
   a RF conductive connector having a first end, the first end comprising a coil clamp configured to be coupled to an uppermost winding of a coil antenna assembly; and
   a conductive member having a first portion and a second portion, each portion having a first end and a second end, the first end of the of the first portion is electrically connected to a first end of the coil antenna assembly through the RF conductive connector, the second end of the first portion rigidly connected to a first end of the second portion, the second portion having a rod shape, the first portion extending outward from the RF conductive connector and the second portion further extending vertically downward from the first portion and parallel to an axis of of the coil antenna assembly, the second portion extending to at least a lowermost winding of the coil antenna assembly, wherein the second end of the second portion of the conductive member is free and unconnected.

2. The electrode assembly of claim 1, wherein the conductive member is a rigid metal structure capable of electrically conducting voltage.

3. The electrode assembly of claim 1, wherein the conductive member is a metal rod.

4. The electrode assembly of claim 1, wherein the second end of the second portion of the conductive member extends proximately to an upper surface of a lid of the semiconductor processing apparatus.

5. The electrode assembly of claim 1, wherein the second end of the second portion of the conductive member overlaps a lid heater disposed on a lid of the semiconductor processing apparatus.

6. The electrode assembly of claim 1, wherein the RF conductive connector is configured to be electrically coupled to the uppermost winding of the coil antenna assembly.

7. The electrode assembly of claim 1, wherein the second portion of the conductive member is configured to be electrically coupled to each winding of the coil antenna assembly from the uppermost winding to the lowermost winding of the coil antenna assembly.

8. The electrode assembly of claim 1, wherein the conductive member is configured to be electrically coupled to the coil antenna assembly by a locking mechanism.

9. The electrode assembly of claim 1, wherein the RF conductive connector or the conductive member is fabricated from a group consisting of stainless steel, copper, aluminum, nickel and alloys thereof.

10. A plasma processing chamber comprising:
    a chamber body;
    a lid enclosing an interior volume of the chamber body;
    a substrate support disposed in the interior volume;
    a coil antenna assembly having a first end and a second end, the second end positioned adjacent to the lid for coupling RF power to the chamber body and the first end positioned distant from the lid; and
    an electrode assembly having a coil clamp connected to an uppermost winding of the first end of the coil antenna assembly and extending towards the second end of the coil antenna assembly, the electrode assembly further comprising a RF conductive connector having a first end coupled to the coil clamp, the electrode assembly further comprising a conductive member having a first portion and a second portion, each portion having a first end and a second end, the first end of the of the first portion electrically connected to the first end of the coil antenna assembly through the RF conductive connector, the second end of the first portion rigidly connected to a first end of the second portion, the second portion having a rod shape, the first portion extending outward from the RF conductive connector and the second portion further extending vertically downward from the first portion and parallel to an axis of the coil antenna assembly, the second portion extending to at least a lowermost winding of the coil antenna assembly, wherein the second end of the second portion of the conductive member is free and unconnected.

11. The chamber of claim 10, wherein the conductive member is a rigid metal structure capable of electrically conducting voltage.

12. The chamber of claim 10, wherein the conductive member is a metal rod.

13. The chamber of claim 10, wherein the electrode assembly is configured to electrically couple to each winding of the coil antenna assembly.

14. The electrode assembly of claim 1, wherein the second end of the second portion of the conductive member extends proximately to an upper surface of a lid of the semiconductor processing apparatus.

15. The chamber of claim 10, wherein the second end of the second portion of the conductive member overlaps a lid heater disposed on the lid of the semiconductor processing chamber.

16. A plasma processing chamber comprising:
    a chamber body;
    a lid enclosing an interior volume of the chamber body;
    a substrate support disposed in the interior volume;
    a coil antenna assembly having a first end and a second end and having a plurality of windings including an uppermost winding and a lowermost winding, the second end positioned adjacent to the lid for coupling RF power to the chamber body and the first end positioned distant from the lid; and
    a plurality of electrode assemblies, each electrode assembly having a coil clamp connected to the uppermost winding of the plurality of windings of the coil antenna assembly and extending towards the second end of the coil antenna assembly, wherein each electrode assembly further comprises: a RF conductive connector having a first end coupled to the coil clamp, and a conductive member having a first portion and a second portion, each portion having a first end and a second end, the first end of the of the first portion electrically connected to the first end of the coil antenna assembly through the RF conductive connector, the second end of the first portion rigidly connected to a first end of the second portion, the second portion having a rod shape, the first portion extending outward from the RF conductive connector and the second portion further extending vertically downward from the first portion and parallel to an axis of the coil antenna assembly, the second portion extending to at least a lowermost winding of the coil antenna assembly, wherein the second end of the second portion of the conductive member is free and unconnected.

17. The chamber of claim 16, wherein the conductive member is a rigid metal structure capable of electrically conducting voltage.

* * * * *

UNITED STATES PATENT AND TRADEMARK OFFICE
CERTIFICATE OF CORRECTION

PATENT NO. : 10,290,469 B2  
APPLICATION NO. : 14/293516  
DATED : May 14, 2019  
INVENTOR(S) : Valentin M. Todorow et al.

Page 1 of 1

It is certified that error appears in the above-identified patent and that said Letters Patent is hereby corrected as shown below:

In the Claims

In Column 7, Line 15, in Claim 1, delete "of the of the" and insert -- of the --, therefor.

In Column 7, Line 15, in Claim 1, after "portion" delete "is".

In Column 7, Line 23, in Claim 1, delete "of of" and insert -- of --, therefor.

In Column 8, Line 6, in Claim 10, delete "of the of the" and insert -- of the --, therefor.

In Column 8, Line 28, in Claim 14, delete "The electrode assembly of claim 1," and insert -- The chamber of claim 10, --, therefor.

In Column 8, Line 31, in Claim 14, delete "apparatus." and insert -- chamber. --, therefor.

In Column 8, Line 55, in Claim 16, delete "of the of the" and insert -- of the --, therefor.

Signed and Sealed this  
Sixteenth Day of July, 2019

Andrei Iancu  
*Director of the United States Patent and Trademark Office*